United States Patent
Mi et al.

(10) Patent No.: US 12,284,832 B2
(45) Date of Patent: Apr. 22, 2025

(54) SUB PIXEL AND SIGNAL LINE ARRANGEMENTS FOR DISPLAY PANEL AND DISPLAY DEVICE

(71) Applicant: Yungu (Gu'an) Technology Co., Ltd., Hebei (CN)

(72) Inventors: Lei Mi, Langfang (CN); Hongrui Li, Langfang (CN); Yusheng Liu, Langfang (CN)

(73) Assignee: Yangu (Gu'an) Technology Co., Ltd., Langfang (CN)

( * ) Notice: Subject to any disclaimer, the term of this patent is extended or adjusted under 35 U.S.C. 154(b) by 0 days.

(21) Appl. No.: 18/530,488

(22) Filed: Dec. 6, 2023

(65) Prior Publication Data
US 2024/0120348 A1    Apr. 11, 2024

Related U.S. Application Data

(63) Continuation of application No. PCT/CN2023/090834, filed on Apr. 26, 2023.

(30) Foreign Application Priority Data

Jun. 22, 2022    (CN) .......................... 202210711365.X

(51) Int. Cl.
*H10D 86/60* (2025.01)
*H04N 23/57* (2023.01)
*H10D 86/40* (2025.01)

(52) U.S. Cl.
CPC ............. *H10D 86/60* (2025.01); *H04N 23/57* (2023.01); *H10D 86/441* (2025.01)

(58) Field of Classification Search
CPC ..................................................... H01L 27/124
See application file for complete search history.

(56) References Cited

U.S. PATENT DOCUMENTS

2022/0102421 A1*    3/2022    Yang .................... H10K 59/353

FOREIGN PATENT DOCUMENTS

| CN | 107689196 A | 2/2018 |
|----|-------------|--------|
| CN | 110459175 A | 11/2019 |
| CN | 112151592 A | 12/2020 |
| CN | 113838888 A | 12/2021 |
| CN | 114141851 A | 3/2022 |
| CN | 115064572 A | 9/2022 |

OTHER PUBLICATIONS

International Search Report issued on Jul. 19, 2023, in corresponding International Application No. PCT/CN2023/090834; 5 pages.

* cited by examiner

*Primary Examiner* — Gustavo Polo
(74) *Attorney, Agent, or Firm* — Maier & Maier, PLLC

(57) ABSTRACT

A display panel and a display device. The display panel includes sub-pixels, a driving circuit for driving at least a part of the sub-pixels, and a signal line connecting the sub-pixel and the driving circuit, the driving circuit is located on a side of the sub-pixel in a first direction, the signal line includes an extension segment extending along the first direction, a plurality of extension segments of a plurality of signal lines are arranged side by side along a second direction, and the first direction intersects the second direction. The display panel includes a plurality of region segments arranged side by side along the second direction, the plurality of region segments include at least two adjacent first region segment and second region segment.

20 Claims, 4 Drawing Sheets

SUB PIXEL AND SIGNAL LINE ARRANGEMENTS FOR DISPLAY PANEL AND DISPLAY DEVICE

CROSS-REFERENCE TO RELATED APPLICATION

The present application is a continuation of International Application No. PCT/CN2023/090834 filed on Apr. 26, 2023, which claims priority to Chinese Patent Application No. 202210711365.X, filed on Jun. 22, 2022 and entitled "DISPLAY PANEL AND DISPLAY DEVICE", both of which are hereby incorporated by reference in their entireties.

TECHNICAL FIELD

The present application relates to a technical field of display, and particularly relates to a display panel and a display device.

BACKGROUND

With the rapid development of electronic devices, the user's requirements for screen-to-body ratio are getting higher and higher, thereby making the full-screen display of the electronic devices receive more and more attention from the industry.

Conventional electronic devices, such as cell phones, tablets, and the like, require the integration of, for example, front-facing cameras, handsets, and infrared sensing elements. In the existing technology, by notching or opening on the display screen, external light can enter into the photosensitive component located below the screen through the notch or opening on the screen. However, these electronic devices are not truly full-screen, and cannot display in all regions of the entire screen. For example, the region corresponding to the front-facing camera cannot display the picture.

SUMMARY

The embodiments of the present application provide a display panel and a display device, which can realize that at least a part of the display panel is transparent and displayable, thereby facilitating the under-screen integration of the photosensitive components.

In a first aspect, an embodiment of the present application provides a display panel, wherein the display panel includes sub-pixels, a driving circuit for driving at least a part of the sub-pixels, and a signal line connecting the sub-pixel and the driving circuit, the driving circuit is located on a side of the sub-pixel in a first direction, the signal line includes an extension segment extending along the first direction, a plurality of extension segments of a plurality of signal lines are arranged side by side along a second direction, and the first direction intersects the second direction; wherein the display panel includes a plurality of region segments arranged side by side along the second direction, the plurality of region segments include at least two adjacent first region segment and second region segment, the first region segment is provided with A1 sub-pixels arranged side by side along the first direction and B1 extension segments arranged side by side along the second direction, the second region segment is provided with A2 sub-pixels arranged side by side along the first direction and B2 extension segments arranged side by side along the second direction, A1 is less than A2, A1 is less than B1, and A1, B1, A2, and B2 are all natural numbers.

In a second aspect, an embodiment of the present application provides a display device, including the display panel in any of the above embodiments.

According to the display panel of the embodiments of the present application, the display panel includes the sub-pixels, the driving circuit, and the signal line connecting the driving circuit and the sub-pixel, the signal line includes the extension segment extending along the first direction. Therefore, the distance between the sub-pixel and the driving circuit can be increased by reasonably setting the length of the extension segment, thereby reducing the distribution area of the metal material in the region where the sub-pixel is located, increasing the light transmittance of the region where the sub-pixel is located, and achieving light transmitting and display of the region where the sub-pixel is located. Further, the under-screen integration of the photosensitive components such as cameras can be realized.

According to the display panel of the embodiments of the present application, the display panel includes the plurality of region segments, and in at least two adjacent first region segment and second region segment, the number A1 of the sub-pixels in the first region segment is less than the number A2 of the sub-pixels in the second region segment, and the number A1 of the sub-pixels in the first region segment is also less than the number of the extension segments in the first region segment. That is, a larger number of extension segments are arranged in the region segment in which the number of the sub-pixels is smaller, so that the arrangement of the extension segments corresponding to a plurality of sub-pixels is more uniform, and it is also possible to increase the number of the extension segments to be provided, which in turn enables the arrangement of more sub-pixels, and can expand the area of the transparent display region.

BRIEF DESCRIPTION OF THE DRAWINGS

Other features, purposes and advantages of the present application will be more apparent by reading the following detailed description of the non-restrictive embodiments with reference to the drawings. Here, the same or similar reference numbers indicate the same or similar features, and the drawings are not drawn to actual scale.

DETAILED DESCRIPTION

Figure 1:
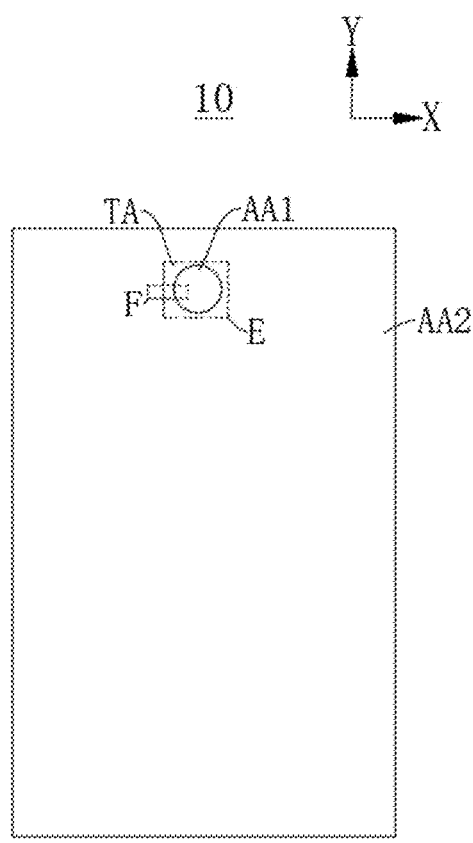
FIG. 1 illustrates a schematic top view of a display panel according to an embodiment of the present application.

Features and exemplary embodiments of various aspects of the present application are described in detail below. In order to clarify the purposes, technical solutions and advantages of the present application, the present application will be further described in detail below in combination with the accompanying drawings and specific embodiments. It should be understood that the specific embodiments described herein are intended to interpret the present application and not to limit the present application. For those skilled in the art, the present application may be practiced without some of these specific details. The following description of the embodiments is merely to provide a better understanding of the present application by illustrating examples of the present application.

In an electronic device such as a cell phone and a tablet computer, it is necessary to integrate a photosensitive component, such as a front-facing camera, an infrared light sensor, a proximity light sensor, and the like, on the side where the display panel is provided. In some embodiments, a transparent display region may be provided on the above electronic device, and the photosensitive component may be provided at the back of the transparent display region, so that a full-screen display of the electronic device can be realized under the condition of ensuring that the photosensitive component works properly.

In some display panels, in order to improve the light transmittance of the transparent display region, a driving circuit for driving sub-pixels within the transparent display region is usually arranged outside the transparent region (e.g., in a transition region), and a signal line is used to connect the driving circuit to the sub-pixel within the transparent display region. Typically, the signal line extends in a direction along which the driving circuit and the sub-pixels are spaced apart. For example, the signal line extends in a row direction, and is configured to connect the sub-pixels and the driving circuit spaced apart along the row direction. Under a condition that the numbers of the sub-pixels in two adjacent rows in the transparent display region are different, the distribution densities of the signal lines in the region where the two adjacent rows are located are different, and further, the number of the signal lines distributed in the region where the sub-pixels in a single row are located is limited. Therefore, the number of the sub-pixels adopting such a method is restricted, which in turn leads to the area of the transparent display region being restricted and cannot be adapted to the requirements of the transparent display region of large size.

In order to solve the above problem, the embodiments of the present application provide a display panel and a display device, and various embodiments of the display panel and the display device will be described below in connection with the accompanying drawings.

The embodiments of the present application provide a display panel, which may be an Organic Light Emitting Diode (OLED) display panel.

Figure 2:
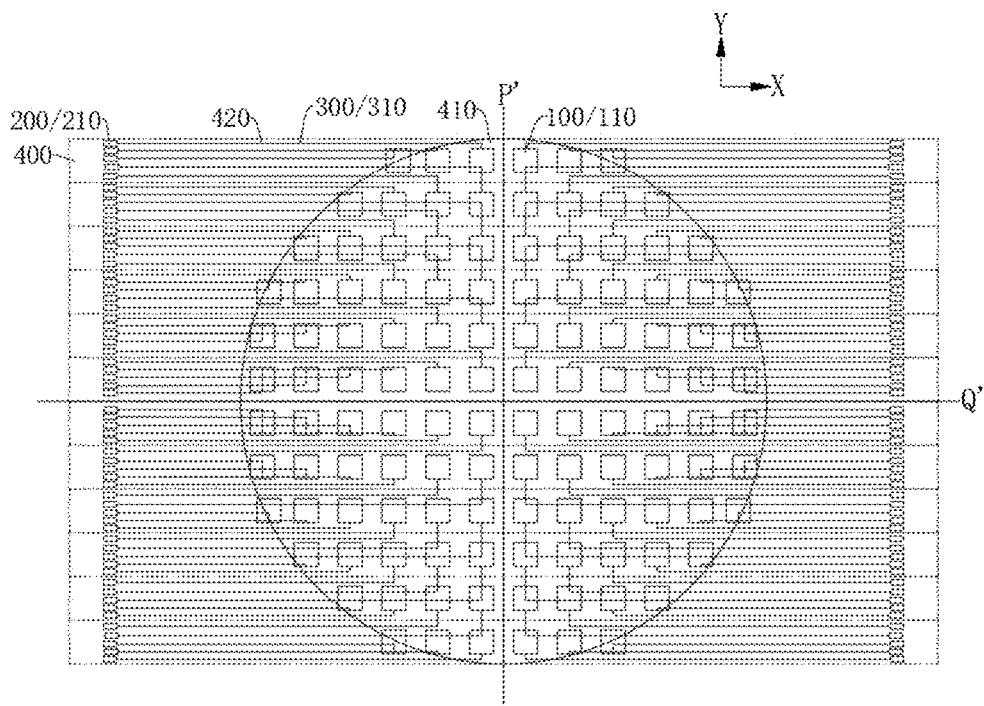
FIG. 2 illustrates a local enlarged view of a region E in FIG. 1 according to an example.
Figure 3:
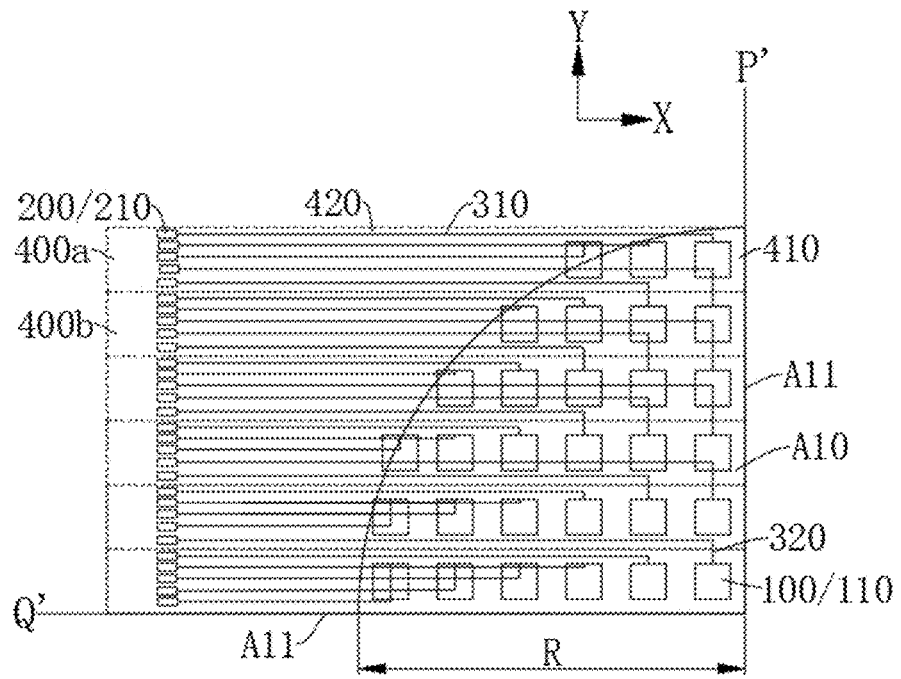
FIG. 3 illustrates a local enlarged schematic structural view of FIG. 2.

FIG. 1 illustrates a schematic top view of a display panel 10 according to an embodiment of the present application; FIG. 2 illustrates a local enlarged view of a region E in FIG. 1 according to an example. FIG. 3 illustrates a local enlarged schematic structural view of FIG. 2.

As shown in FIGS. 1 to 3, the embodiments of the present application provide a display panel 10. The display panel 10 includes sub-pixels 100, a driving circuit 200 for driving at least a part of the sub-pixels 100, and a signal line 300 connecting the sub-pixel 100 and the driving circuit 200, the driving circuit 200 is located on a side of the sub-pixel 100 in a first direction X, the signal line 300 includes an extension segment 310 extending along the first direction X, a plurality of extension segments 310 of a plurality of signal lines 300 are arranged side by side along a second direction Y, and the first direction X intersects the second direction Y; wherein the display panel 10 includes a plurality of region segments 400 arranged side by side along the second direction Y, the plurality of region segments 400 include at least two adjacent first region segment 400a and second region segment 400b, the first region segment 400a is provided with A1 sub-pixels 100 arranged side by side along the first direction X and B1 extension segments 310 arranged side by side along the second direction Y, the second region segment 400b is provided with A2 sub-pixels 100 arranged side by side along the first direction X and B2 extension segments 310 arranged side by side along the second direction Y, A1 is less than A2, A1 is less than B1, and A1, B1, A2, and B2 are all natural numbers.

The scope of the region segment 400 is illustrated by dashed lines in FIGS. 2 and 3, and the dashed lines do not constitute a structural limitation of the embodiments of the present application. As shown in FIG. 3, the number of the region segments 400 is 6, and in other embodiments, the number of the region segments 400 may be 2, 3, 4 or more, and so on.

The plurality of sub-pixels 100 are arranged in rows and columns along the first direction X and the second direction Y. The first direction X is a row direction, and the second direction Y is a column direction. Optionally, the first region segment 400a is provided with a row of sub-pixels 100, and the number of sub-pixels 100 within the first region segment 400a is A1. Alternatively, the first region segment 400a is provided with a plurality of rows of sub-pixels 100a, wherein the number of sub-pixels 100a in a row is A1.

The first region segment 400a is also provided with a plurality of extension segments 310, the plurality of extension segments 310 are arranged side by side along the second direction Y in the first region segment 400a, and the number of extension segments 310 in the first region segment 400a is B1.

Optionally, the second region segment 400b is provided with a row of sub-pixels 100, and the number of sub-pixels 100 within the second region segment 400b is A2. Alternatively, the second region segment 400b is provided with a plurality of rows of sub-pixels 100a, wherein the number of sub-pixels 100a in a row is A2. Optionally, the numbers of rows of sub-pixels 100a arranged within the first region segment 400a and the second region segment 400b are the same.

The second region segment 400b is also provided with a plurality of extension segments 310, the plurality of extension segments 310 are arranged side by side along the second direction Y in the second region segment 400b, and the number of extension segments 310 in the second region segment 400b is B1. A1, A2, B1, B2 are all natural numbers.

According to the display panel 10 of the embodiments of the present application, the display panel 10 includes the sub-pixels 100, the driving circuit 200, and the signal line 300 connecting the driving circuit 200 and the sub-pixel 100, the signal line 300 includes the extension segment 310 extending along the first direction X. Therefore, the distance between the sub-pixel 100 and the driving circuit 200 can be increased by reasonably setting the length of the extension segment 310, thereby reducing the distribution area of the metal material in the region where the sub-pixel 100 is located, increasing the light transmittance of the region where the sub-pixel 100 is located, and achieving light transmitting and display of the region where the sub-pixel 100 is located. Further, the under-screen integration of the photosensitive components such as cameras can be realized.

According to the display panel 10 of the embodiments of the present application, the display panel 10 includes the plurality of region segments 400, and in at least two adjacent first region segment 400a and second region segment 400b, the number A1 of the sub-pixels 100 in the first region segment 400a is less than the number A2 of the sub-pixels 100 in the second region segment 400b, and the number A1 of the sub-pixels 100 in the first region segment 400a is also less than the number of the extension segments 310 in the first region segment 400a. That is, a larger number of extension segments 310 are arranged in the region segment 400 in which the number of the sub-pixels 100 is smaller, so that the arrangement of the extension segments 310 corresponding to a plurality of sub-pixels 100 is more uniform, and it is also possible to increase the number of the extension segments 310 to be provided, which in turn enables the arrangement of more sub-pixels 100, and can expand the area of the transparent display region.

The extension segment 310 corresponding to the sub-pixel 100 is an extension segment 310 on the signal line 300 connecting the sub-pixel 100 to the driving circuit 200.

In the plurality of region segments 400, there should be two adjacent first region segment 400a and second region segment 400b, and under a condition that the number of sub-pixels 100 in the first region segment 400a is less than the number of sub-pixels 100 in the second region segment 400b, the number of sub-pixels 100 in the first region segment 400a is also less than the number of extension segments 310 in the first region segment 400a. In other region segments 400, the numbers of sub-pixels 100 and the numbers of extension segments 310 in the other two adjacent region segments 400 may be the same or different.

There are various ways of setting the region segments 400. As shown in FIG. 3, the region segment 400 may include a display segment 410 and a transition segment 420 arranged along the first direction X, the sub-pixel 100 is located in the display segment 410, and at least a part of the extension segment 310 is located in the transition segment 420. Therefore, the sub-pixel 100 and the extension segment 310 are disposed in separate regions, thereby further improving the light transmittance of the display segment 410. The dividing line between the display segments 410 and the transition segments 420 of the plurality of region segments 400 in FIG. 2 is in the shape of a circular arc, and the arcuate solid line in FIG. 3 is to illustrate the dividing line between the display segments 410 and the transition segments 420 within the region segments 400. The arcuate solid line does not constitute a structural limitation of the embodiments of the present application.

Optionally, the driving circuit 200 and at least a part of the signal line 300 are located in the transition segment 420. As shown in FIG. 2, the driving circuits 200 within the same region segment 400 may be arranged side by side in the second direction Y. In other embodiments, the driving circuits 200 within the same region segment 400 may also be arranged side by side in the first direction X.

Figure 4:
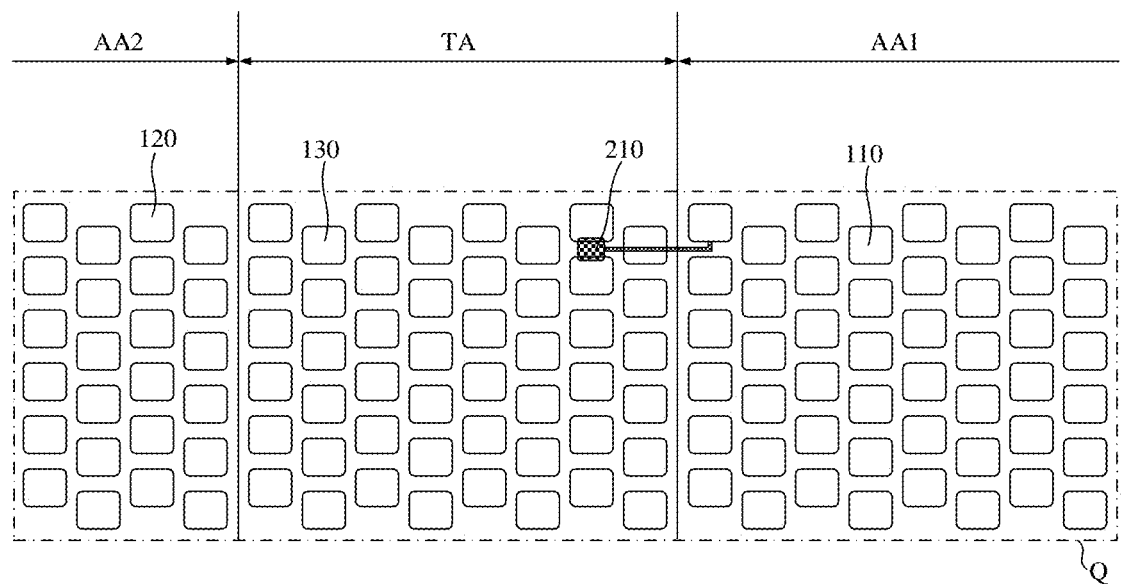
FIG. 4 illustrates a local enlarged view of a region F in FIG. 1 according to an example.

As shown in FIG. 4, FIG. 4 is a local enlarged schematic structural view of a region F in FIG. 1. In other embodiments, the transition segment 420 may be provided with sub-pixels 100, thereby enabling the transition segment 420 to display. Alternatively, in other embodiments, the transition segment 420 may not be provided with sub-pixels 100, thereby making the transition segment 420 as a non-display region.

The sub-pixels 100 may be arranged in a variety of ways. As shown in FIGS. 2 and 3, the plurality of sub-pixels 100 may be arranged in rows and columns along the first direction X and the second direction Y, and the plurality of sub-pixels 100 may be arranged in an aligned manner along the first direction X and the second direction Y. Alternatively, as shown in FIG. 4, two adjacent columns of sub-pixels 100 are arranged in a staggered manner along the first direction X.

The plurality of region segments 400 are arranged side by side along the second direction Y, and the plurality of region segments 400 may be arranged in an aligned manner or in a staggered manner in the second direction Y. The display segments 410 of the plurality of region segments 400 may be arranged in an aligned manner or in a staggered manner in the second direction Y. The transition segments 420 of the plurality of region segments 400 may be arranged in an aligned manner or in a staggered manner in the second direction Y.

Optionally, as shown in FIG. 3, the display segments 410 of at least two region segments 400 adjacent along the second direction Y at least partially overlap. That is, the display segments 410 adjacent along the second direction Y at least partially overlap in the second direction Y, and the plurality of display segments 410 are combined to form the first display region AA1. Optionally, the at least two adjacent display segments 410 at least partially overlap in the second direction Y, so that the distribution of the display segments 410 is more centralized, and the display segments 410 may form the first display region AA1 with a more regular area, which facilitates the setting of the photosensitive element in the display segments 410.

The plurality of transition segments 420 are combined to form a transition region TA. Optionally, at least two transition segments 420 adjacent along the second direction Y at least partially overlap. That is, the adjacent transition segments 420 at least partially overlap in the second direction Y, so that the distribution of the transition segments 420 is more centralized, and the transition region TA is formed with a more concentrated area.

Optionally, in two adjacent region segments 400, as shown in FIG. 3, the display segment 410 of one region segment 400 at least partially overlaps the transition segment 420 of the other region segment 400 along the second direction Y, which can reduce the distance between the display segment 410 and the transition segment 420 in the same region segment 400, and reduce the distance of the extension segment 310.

Optionally, the plurality of extension segments 310 are evenly distributed along the second direction Y within the transition segment 420. And/or, the plurality of extension segments 310 are evenly distributed along the second direction Y within the transition region TA. On the one hand, it is convenient for wiring, and on the other hand, it is possible to arrange more extension segments 310 within the transition segment 420. Therefore, more sub-pixels 100 can be arranged, and the area of the transparent display region can be expanded.

Optionally, the first display region AA1 may be a transparent display region, and the driving circuit 200 for driving the sub-pixels 100 within the first display region AA1 is located in the transition region TA. Optionally, the transition region TA is arranged around at least a part of the first display region AA1.

Optionally, the display panel 10 further includes a second display region AA2, the second display region AA2 is arranged around at least a part of the first display region AA1, and the second display region AA2 may be located on a side of the transition region TA away from the first display region AA1, or the second display region AA2 may be located between the first display region AA1 and the transition region TA. For example, under a condition that the transition region TA is displayable, the second display region AA2 is located on the side of the transition region TA away from the first display region AA1, and under a condition that the transition region TA is not displayable, the second display region AA2 is located between the first display region AA1 and the transition region TA, so as to ensure the coherence of the display region.

Optionally, the light transmittance of the first display region AA1 is greater than the light transmittance of the second display region AA2.

Herein, it is preferred that the light transmittance of the first display region AA1 is greater than or equal to 15%. To ensure that the light transmittance of the first display region AA1 is greater than 15%, or even greater than 40%, or even a higher light transmittance, the light transmittance of each functional film layer of the display panel 10 in this embodiment is greater than 80%, or even the light transmittances of at least some of the functional film layers are greater than 90%.

According to the display panel 10 of the embodiments of the present application, the light transmittance of the first display region AA1 is greater than the light transmittance of the second display region AA2, so that the display panel 10 can integrate a photosensitive component on the back of the first display region AA1, thereby realizing the under-screen integration of the photosensitive component such as a camera. At the same time, the first display region AA1 is capable of displaying a picture, which improves the display area of the display panel 10, and realizes the full-screen design of the display device.

Optionally, as shown in FIG. 4, the plurality of sub-pixels 100 includes first sub-pixels 110 located in the first display region AA1 and second sub-pixels 120 located in the second display region AA2, and the driving circuit 200 includes a first driving circuit 210 for driving the first sub-pixels 110 and a second driving circuit for driving the second sub-pixels 120. Only one of the first driving circuits 210 is illustrated in FIG. 4, and there may be a plurality of first driving circuits 210.

In an embodiment of the present application, the first driving circuit 210 is connected to the first sub-pixel 110 via the signal line 300, and the first driving circuit 210 and at least a part of the signal line 300 may be located in the transition region TA, thereby further improving the light transmittance of the first display region AA1.

Optionally, as shown in FIG. 4, the plurality of sub-pixels 100 may further include third sub-pixels 130 located in the transition region TA, and the driving circuit 200 may further include a third driving circuit for driving the third sub-pixels 130.

In an embodiment of the present application, the number A1 of the first sub-pixels 110 within the first region segment 400a is less than the number A2 of the first sub-pixels 110 within the second region segment 400b, and at the same time, the number A1 of the first sub-pixels 110 within the first region segment 400a is less than the number of the extension segments 310 within the first region segment 400a. That is, a larger number of extension segments 310 are arranged in the region segment 400 in which the first sub-pixels 110 are fewer, so that the arrangement of the extension segments 310 corresponding to the plurality of first sub-pixels 110 is more uniform, and it is possible to increase the number of the extension segments to be provided, which in turn enables the arrangement of more first sub-pixels 110 within the first display region AA1, and can ensure that the area of the first display region AA1 is large enough. The extension segment 310 corresponding to the first sub-pixel 110 is an extension segment 310 on the signal line 300 connecting this first sub-pixel 110 to the first driving circuit 210.

The first display region AA1 and the transition region TA may be arranged in various ways, the first display region AA1 may be a circle, the transition region TA may be a circular ring surrounding the first display region AA1, or the transition region TA includes two semi-circular rings symmetrically arranged relative to the first display region AA1. For drawing convenience, in FIGS. 2 and 3, the end portions of the extension segments 310 of the plurality of signal lines 300 away from the first sub-pixels 110 are arranged in an aligned manner in the second direction Y. That is, the plurality of first driving circuits 210 are arranged in an aligned manner in the second direction Y. In other embodiments, the end portions of the extension segments 310 of the plurality of signal lines 300 away from the first sub-pixels 110 may also be arranged in a staggered manner in the second direction Y. For example, the end portions of the plurality of extension segments 310 away from the first sub-pixels 110 are spaced apart along an arcuate trajectory around the first display region AA1. The plurality of first driving circuits 210 may also be spaced apart along an arcuate trajectory around the first display region AA1.

In some optional embodiments, please continue to refer to FIG. 2, the region segment 400 includes a display segment 410 and two transition segments 420, and the two transition segments 420 are separated on two sides of the display segment 410 in the first direction X, so that within the same region segment 400, the signal lines 300 connected to the plurality of sub-pixels 100 in the display segment 410 can be symmetrically arranged in the two transition segments 420. By arranging two transition segments 420, more extension segments 310 can be accommodated, which in turn can arrange more sub-pixels 100 in the display segment 410, and can ensure that the area of the first display region AA1 is large enough.

In some optional embodiments, please continue to refer to FIGS. 2 and 3, FIG. 3 is a schematic structural view corresponding to one of the sub-regions A10 in FIG. 2. The first display region AA1 includes four sub-regions A10 having an identical area and an identical shape, and in any two adjacent sub-regions A10, a plurality of the sub-pixels 100 and the signal lines 300 connected to the plurality of the sub-pixels 100 are arranged symmetrically. For example, as shown in FIG. 2, in two sub-regions A10 adjacent along the first direction X, the plurality of first sub-pixels 110 and the signal lines 300 connected to the plurality of first sub-pixels 110 are arranged symmetrically with respect to a second axis P' extending along the second direction Y; and in two sub-regions A10 adjacent along the second direction Y, the plurality of first sub-pixels 110 and the signal lines 300 connected to the plurality of first sub- pixels 110 are arranged symmetrically with respect to a first axis Q' extending along the first direction X. The intersection of the first axis line P' and the second axis line Q' is a center of the first display region AA1.

In these optional embodiments, the symmetrical arrangement of the first sub-pixels 110 and the signal line 300 connected to the first sub-pixels 110 in the adjacent sub-regions A10 can simplify the wiring of the signal lines 300 and simplify the preparation of the display panel 10. In addition, it is also capable of avoiding the signal lines 300 corresponding to the adjacent sub-regions A10 from interfering with each other crosswise.

As shown in FIG. 3, the sub-region A10 includes two first side edges A11 that are intersecting and an outer edge connected between the two first side edges A11. The outer edge is a part of the edge of the first display region AA1, and the first side edges A11 are located at the first axis P' and the second axis Q'.

The shape of the first display region AA1 may be set in various ways, and the shape of the first display region AA1 may be a circle, an oval, a triangle, a quadrilateral, or other polygon, and the like. Here, in the first display region AA1, there are at least two adjacent rows having different numbers of sub-pixels 100.

In some optional embodiments, the shape of the first display region AA1 is an n-regular-polygon, n is greater than or equal to 4, or the shape of the first display region AA1 is a circle, which facilitates the division of the first display region AA1 into four sub-regions A10 having an identical shape and an identical area. The first display region AA1 being a circle is illustrated as an example in FIGS. 2 and 3, and in other embodiments, the first display region AA1 may also be a polygon.

Optionally, the first display region AA1 is an n-regular-polygon, n is greater than or equal to 4 and n is an even number, and the first display region AA1 includes n side edges. Under a condition that n is an even number, the intersection of the first side edge A11 of the sub-region A10 and the outer edge may be at the location of the intersection of the two side edges in the polygonal first display region AA1 or at the center of the side edges, which facilitates the division of the four sub-regions A10.

In some optional embodiments, since the four sub-regions A10 have an identical area and an identical shape, the first side edges A11 of the sub-region A10 have an identical length. The length of the first side edge A11 is R, the distribution size of the extension segment 310 in the second direction Y is S, the distribution size of the sub-pixel 100 is P, and the same driving circuit 200 is configured to drive n sub-pixels 100 in the sub-region A10, that is, the same first driving circuit 210 is configured to drive n first sub-pixels 110, then the length R of the first side edge A11 satisfies:

$$\frac{R}{S} = \frac{\pi R^2}{P}/4n \quad (1)$$

In the above embodiment, S is the distribution width of the extension segment 310, and the distribution width includes a width of the extension segment 310 itself and a wiring gap between two adjacent extension segments 310. That is, the regions where the distribution widths of the two adjacent extension segments 310 are located share a same edge. The distribution size of the sub-pixel 100 includes an area of the sub-pixel 100 itself and a spacing between the sub-pixel 100 and its peripheral sub-pixel 100. That is, the regions where the distribution sizes of the two adjacent sub-pixels 100 are located share a same edge.

In equation (1), under a condition that the length of the first side edge A11 is R, and under a condition that the plurality of extension segments 310 are evenly distributed within the sub-region A10, a maximum of R/S extension segments 310 can be arranged in the sub-region A10. Further, the area of the sub-region A10 is one-fourth of the area of the first display region AA1, a maximum of $$\frac{\pi R^2}{P}/4$$

first sub-pixels 110 can be arranged in the sub-region A10. Since the same first driving circuit 210 drives n first sub-pixels 110, then the extension segment 310 of the same signal line 300 can be connected to a maximum of n first sub-pixels 110, and thus the number of extension segments 310 corresponding to a plurality of first sub-pixels 110 in the sub-region A10 is $$\frac{\pi R^2}{P}/4n.$$

Therefore, the maximum value of the length R of the first side edge A11 is calculated by the above equation (1), that is, the maximum area of the first display region AA1 is calculated. Under a condition that the length R of the first side edge A11 satisfies the above equation, the area of the first display region AA1 is large enough.

Assuming that S is 5 μm, P is 62.5×62.5 μm², and under a condition that a first driving circuit 210 drives two first sub-pixels 110, the two first sub-pixels 110 correspond to one signal line 300. In related art, under a condition that the first sub-pixels 110 and the extension segment 310 connected to the first sub-pixels 110 are both located in the same region segment 400, and two rows of first sub-pixels 110 are arranged in the region segment 400, a maximum of 62.5× 2/5=25 lines can be arranged in the region segment 400. Then, 24 extension segments 310 correspond to the anodic signals of 12 first sub-pixels 110, and one extension segment 310 is remained. The length R of the first side edge A11 corresponding to the 24 extension segments 310 is 12×62.5 μm; and the entire width of the first display region AA1 is 2R=1.5 mm. However, the space of 1.5 mm cannot meet the current space requirement of the under-screen photosensitive component.

In the embodiment of the present application, bringing S=5 μm, P=62.5×62.5 μm², and n=2 into the equation (1) can obtain that the length R of the first side edge A11 is approximately equal to 2 mm, and the entire width of the first display region AA1 is 2R=4 mm Therefore, the embodiment of the present application can increase the size of the first display region AA1.

Optionally, in the equation (1), the left side of the equal sign is rounded to a nearest integer, and the right side of the equal sign is also rounded to a nearest integer, which can reduce the calculation error.

In other embodiments, the plurality of extension segments 310 are evenly distributed within the region segment 400, the width of the region segment 400 in the first direction X is W, and the length R of the first side edge A11 satisfies:

$$\frac{R}{W}M = \frac{\pi * R^2}{P}/4n \quad (2)$$

Wherein M=W/S, and M is a positive integer.

In the above equation (2), under a condition that the length of the first side edge A11 of the sub-region A10 is R, and the width of the region segment 400 is W, then a maximum of R/W region segments 400 can be arranged in the sub-region A10. Further, a maximum of W/S=M extension segments 310 can be arranged in the region segment 400, and thus a maximum of RM/W extension segments 310 can be arranged in the sub-region A10. From the above analysis, it can be known that the number of extension segments 310 corresponding to $$\frac{\pi R^2}{P}/4n.$$

the plurality of first sub-pixels 110 in the sub-region A10 is Therefore, the maximum value of the length R of the first side edge A11 is calculated by the above equation (2), that is, the maximum area of the first display region AA1 is calculated. Under a condition that the length R of the first side edge A11 satisfies the above equation, the area of the first display region AA1 is large enough.

Optionally, in the above equation (2), R/M is rounded to a nearest integer, and the right side of the equal sign is also rounded to a nearest integer, which can reduce the calculation error.

In some optional embodiments, B1=B2, so that the extension segments 310 can be evenly distributed within the adjacent first region segment 400a and the second region segment 400b, and more extension segments 310 can be arranged, and thus more first sub-pixels 110 can be arranged, which can ensure that the area of the first display region AA1 is large enough. Optionally, numbers of the extension segments 310 distributed within the region segments 400 are equal, so that the plurality of extension segments 310 are evenly distributed within the plurality of region segments 400, and more extension segments 310 can be arranged, and thus more first sub-pixels 110 can be arranged, which can ensure that the area of the first display region AA1 is large enough.

In some optional embodiments, the extension segment 310 corresponding to the sub-pixel 100 in at least one region segment 400 is located in a region segment 400 adjacent to the at least one region segment 400. That is, the extension segment 310 corresponding to the first sub-pixel 110 in the at least one region segment 400 is located in the region segment 400 adjacent to the at least one region segment 400.

In these optional embodiments, on the one hand, under a condition that the number of first sub-pixels 110 within the region segment 400 is large, the number of extension segments 310 corresponding to the first sub-pixels 110 within the region segment 400 is large, thereby making it difficult to arrange these extension segments 310 within the same region segment 400. Therefore, arranging the extension segment 310 of at least a part of the region segments 400 within the adjacent region segment 400 can ensure a safe spacing between the extension segments 310; on the other hand, arranging the extension segment 310 within the adjacent region segment 400 can reduce the distance between the first sub-pixel 110 and the extension segment 310, thereby reducing the wiring distance of the signal lines 300, and simplifying the wiring arrangement of the signal lines 300.

Figure 5:
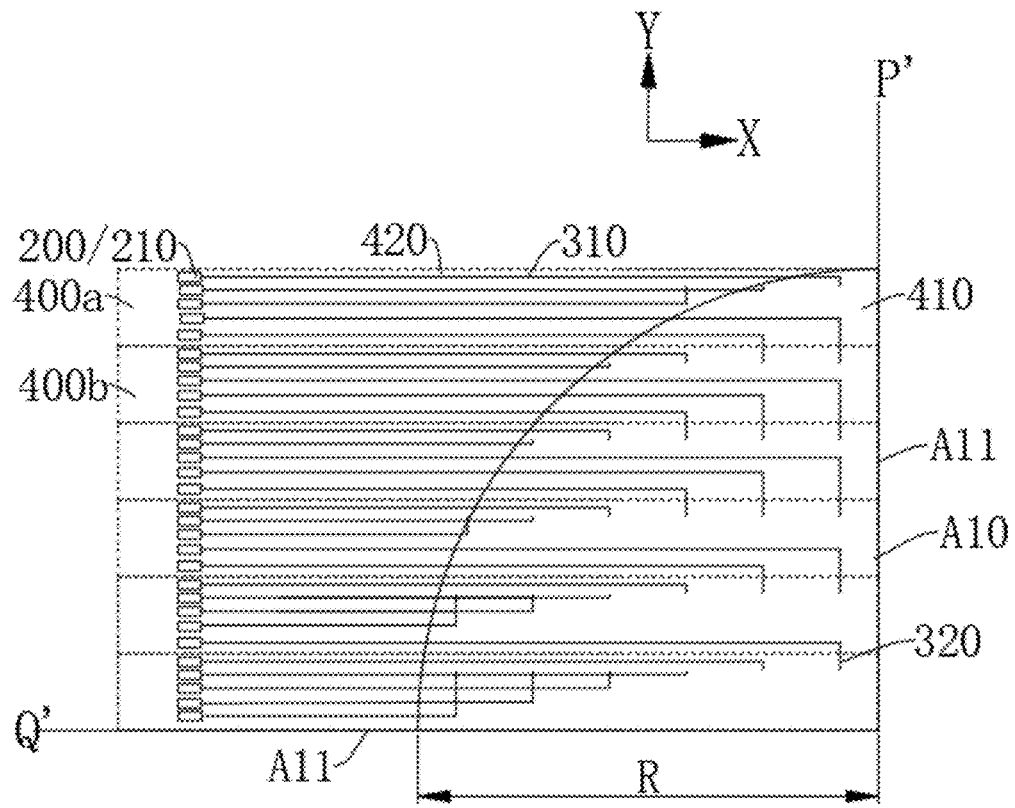
FIG. 5 illustrates a local schematic structural view of FIG. 3.

In some optional embodiments, referring to FIGS. 3 and 5, FIG. 5 is a schematic structural view of the signal line 300 in FIG. 3. As shown in FIGS. 3 and 5, at least a part of the signal lines 310 each further includes a connection segment 320, at least a part of the extension segments 310 are connected to the sub-pixels 100 via the connection segment 320, and the connection segment 320 and the extension segment 310 are located in different membrane layers. That is, at least a part of the extension segments 310 are connected to the first sub-pixels 110 located in the first display region AA1 via the connection segment 320.

In these optional embodiments, under a condition that the first sub-pixel 110 and the extension segment 310 corresponding to the first sub-pixel 110 are arranged in a staggered manner along the first direction X, the extension segment 310 may be interconnected with the sub-pixel 100 via the connection segment 320. The staggered arrangement of the connection segment 320 and the extension segment 310 can avoid the connection segment 320 being cross-short-circuited connected with other extension segments 310.

Figure 6:
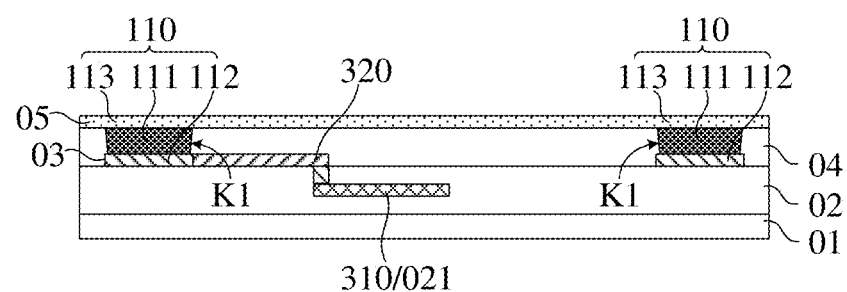
FIG. 6 illustrates a local cross-sectional view of a display panel according to an example.

Referring to FIG. 6, FIG. 6 is a local cross-sectional view of a display panel 10. In some embodiments, as shown in FIG. 6, the display panel 10 includes a substrate 01, a device layer 02, and a pixel definition layer 04. The device layer 02 is disposed on the substrate 01, and the first driver circuit 210 is disposed on the device layer 02. The pixel definition layer 04 is disposed on the device layer 02.

The substrate 01 may be made of a transparent material such as glass, polyimide (PI), and the like. The device layer 02 may include a pixel circuit for driving the display of each sub-pixel 100. The pixel definition layer 04 includes a first pixel opening K1 located in a first display region AA1. In some embodiments, the pixel definition layer 04 includes a second pixel opening located in a second display region AA2 and a third pixel opening located in a transition region TA.

In some embodiments, the first sub-pixel 110 includes a first light-emitting structure 111, a first electrode 112, and a second electrode 113. The first light-emitting structure 111 is disposed within the first pixel opening K1, the first electrode 112 is disposed on a side of the first light-emitting structure 111 toward the substrate 01, and the second electrode 113 is disposed on a side of the first light-emitting structure 111 away from the substrate 01. One of the first electrode 112 and the second electrode 113 is an anode, and the other is a cathode.

In some embodiments, the second sub-pixel 120 includes a second light-emitting structure, a third electrode, and a fourth electrode. The second light-emitting structure is disposed within the second pixel opening, the third electrode is disposed on a side of the second light-emitting structure toward the substrate 01, and the fourth electrode is disposed on a side of the second light-emitting structure away from the substrate 01. One of the third electrode and the fourth electrode is an anode, and the other is a cathode.

In some embodiments, the third sub-pixel 130 includes a third light-emitting structure, a fifth electrode, and a sixth electrode. The third light-emitting structure is disposed within the third pixel opening, the fifth electrode is disposed on a side of the third light-emitting structure toward the substrate 01, and the sixth electrode is disposed on a side of the third light-emitting structure away from the substrate 01. One of the fifth electrode and the sixth electrode is an anode, and the other is a cathode.

In this embodiment, the first electrode 112, the third electrode, and the fifth electrode are anodes, and the second electrode 113, the fourth electrode, and the sixth electrode are cathodes, for example.

Optionally, a first electrode layer 03 is disposed between the device layer 02 and the pixel definition layer 04, and the first electrode 112, the third electrode, and the fifth electrode may be disposed in the first electrode layer 03.

Optionally, a second electrode layer 05 is further disposed on a side of the pixel definition layer 04 away from the device layer 02, and the second electrode 113, the fourth electrode, and the sixth electrode may be disposed in the second electrode layer 05. Optionally, the second electrode 113, the fourth electrode, and the sixth electrode may be face electrodes.

Optionally, the display panel 10 further includes a transparent conductor layer 021 disposed on a side of the first electrode layer 03 toward the substrate 01, and at least a part of the extension sections 310 are disposed in the transparent conductor layer 021.

Optionally, the first electrode 112 includes an indium tin oxide (ITO) layer or an indium zinc oxide layer. In some embodiments, the first electrode 112 is a reflective electrode including a first transparent conductive layer, a reflective layer disposed on the first transparent conductive layer, and a second transparent conductive layer disposed on the reflective layer. Here, the first transparent conductive layer, the second transparent conductive layer may be ITO, indium zinc oxide, and the like, and the reflective layer may be a metal layer, for example made of silver. The third electrode and the fifth electrode 152 each may be configured to use the same material as the first electrode 112.

In some embodiments, the second electrode 113 includes a magnesium-silver alloy layer. The fourth electrode and the sixth electrode each may be configured to use the same material as the second electrode 113. In some embodiments, the second electrode 113, the fourth electrode, and the sixth electrode may be interconnected as a common electrode.

The connection segment 320 is arranged in a variety of locations, and the connection segment 320 may be arranged within a metal layer alone.

Alternatively, the sub-pixel 100 includes pixel electrodes, and as shown in FIG. 5, the connection segment 320 is connected to the pixel electrodes of the sub-pixel 100. The connection segment 320 and the pixel electrodes are disposed in the same layer. On the one hand, the film layer structure of the display panel 10 can be simplified, so that the pixel electrodes and the connection segment 320 can be prepared and molded in the same process step, thereby simplifying the preparation process of the display panel 10. On the other hand, the distance between the connection segment 320 and the pixel electrodes connected to the connection segment 320 can be reduced, thereby ensuring the stability of signal transmission between the pixel electrodes and the connection segment 320.

Optionally, the pixel electrodes include a first electrode 112, a third electrode, and a fifth electrode, and the connection segment 320 is disposed in the first electrode layer 03.

Optionally, the extension segments 310 of the plurality of signal lines 300 are located in the same film layer, so that the plurality of extension segments 310 can be prepared and molded in the same process step, which can simplify the preparation process of the display panel 10 and improve the preparation efficiency of the display panel 10.

There are various ways of arranging the first driving circuit 210, and the first driving circuit 210 may be reasonably arranged according to the position of the extension segment 310, such that one terminal of the extension segment 310 is directly connected to the first driving circuit 210, and the other terminal of the extension segment 310 is connected to the first sub-pixel 110 through the connection segment 320.

Alternatively, the arrangement of the first driving circuit 210 is different from the arrangement of the extension segment 310 toward the terminal of the first driving circuit 210, and a bridge segment may be connected between the extension segment 310 and the first driving circuit 210.

In some optional embodiments, the signal line 300 is a transparent signal line, which can further improve the light transmittance of the display panel 10. For example, the material of the signal line 300 includes ITO, thereby enabling the signal line 300 to have good light transmittance and conductivity.

Figure 7:
FIG. 7 illustrates a local enlarged schematic structural view of a display panel according to another example.

In some optional embodiments, as shown in FIG. 7, FIG. 7 illustrates a schematic view of one of the region segments 400. The display panel 10 further includes a supplemental transition region 500 located on at least one side of the region segment 400 in the first direction X, and at least a part of the signal lines 300 are partially located in the supplementary transition region 500. By adding the supplemental transition region 500, it is possible to further increase the number of the extension segments 310 to be provided, which in turn enables the arrangement of more sub-pixels 100 within the first display region AA1, and ensures that the first display region AA1 has a large distribution area.

The embodiments of the second aspect of the present application further provide a display device including the display panel of any above embodiment of the first aspect. Since the display device provided in the embodiments of the second aspect of the present application includes the display panel of any above embodiment of the first aspect, the display device provided in the embodiments of the second aspect of the present application has the beneficial effect that the display panel of any above embodiment of the first aspect has, which will not be repeated herein.

The display device in the embodiments of the present application includes, but is not limited to, a cellular phone, a Personal Digital Assistant (PDA), a tablet computer, an e-book, a television set, a doorstop, an intelligent landline phone, a console, and other devices with display functions.

According to the embodiments of the present application as described above, these embodiments do not describe all the details and do not limit the present application to the specific embodiments as described. Obviously, there are many modifications and changes that can be made based on the above description. This specification selects and describes these embodiments in order to better explain the principle and practical application of the present application, so that those skilled in the art can make good use of the present application and the modification of the present application. The present application is limited only by the claim and its full scope and equivalents.

What is claimed is:

1. A display panel, wherein the display panel comprises sub-pixels, a driving circuit for driving at least a part of the sub-pixels, and a signal line connecting the sub-pixel and the driving circuit, the driving circuit is located on a side of the sub-pixel in a first direction, the signal line comprises an extension segment extending along the first direction, a plurality of extension segments of a plurality of signal lines are arranged side by side along a second direction, and the first direction intersects the second direction;

wherein the display panel comprises a plurality of region segments arranged side by side along the second direction, wherein at least a part of the signal lines each further comprises a connection segment, at least a part of the extension segments are connected to the sub-pixels via the connection segment, and the connection segment and the extension segment are located in different membrane layers.

2. The display panel according to claim 1, wherein the region segment comprises a display segment and a transition segment arranged along the first direction, the sub-pixel is located in the display segment, and at least a part of the extension segment is located in the transition segment.

3. The display panel according to claim 2, wherein at least two display segments adjacent along the second direction at least partially overlap, and/or at least two transition segments adjacent along the second direction at least partially overlap.

4. The display panel according to claim 2, wherein in two adjacent region segments, the display segment of one region segment at least partially overlaps the transition segment of the other region segment along the second direction.

5. The display panel according to claim 2, wherein the plurality of extension segments are evenly distributed along the second direction within the transition segment.

6. The display panel according to claim 2, wherein a plurality of transition segments are combined to form a transition region where the plurality of extension segments are evenly distributed along the second direction.

7. The display panel according to claim 2, wherein the region segment comprises the display segment and two transition segments, the two transition segments are separated on two sides of the display segment in the first direction, and the signal lines connected to a plurality of the sub-pixels within the display segment are symmetrically distributed in the two transition segments.

8. The display panel according to claim 7, wherein the display segments of the plurality of region segments form a first display region, the first display region comprises four sub-regions having an identical area and an identical shape, and in any two adjacent sub-regions, a plurality of the sub-pixels and the signal lines connected to the plurality of the sub-pixels are arranged symmetrically.

9. The display panel according to claim 8, wherein in the first display region, numbers of the sub-pixels of two display segments adjacent along the second direction are different; a shape of the first display region is an n-regular-polygon, n is greater than or equal to 4, or the shape of the first display region is a circle.

10. The display panel according to claim 8, wherein the sub-region comprises two first side edges that are intersecting and equal, an intersection of the two first side edges is a center of the first display region, a length of the first side edge is R, a distribution width of the extension segment in the second direction is S, a distribution size of the sub-pixel is P, a same driving circuit is configured to drive n sub-pixels in the sub-region, and the length R of the first side edge satisfies:

$$\frac{R}{S} = \frac{\pi R^2}{P}/4n$$

or a width of the region segment in the first direction is W, and the length R of the first side edge satisfies:

$$\frac{R}{W}M = \frac{\pi * R^2}{P}/4n$$

wherein M=W/S, and M is a positive integer.

11. The display panel according to claim 8, wherein a shape of the first display region is an n-regular-polygon, and R is an inscribed circle radius or a circumscribed circle radius of the first display region; or the first display region is a circle, and R is a radius of the first display region.

12. The display panel according to claim 1, wherein the sub-pixel includes a pixel electrode, and at least a part of the connection segment and the pixel electrode are arranged in a same layer.

13. The display panel according to claim 1, wherein the extension segments of the plurality of the signal lines are located in a same membrane layer.

14. The display panel according to claim 1, further comprising a supplementary transition region located on at least one side of the region segment in the first direction, wherein at least a part of the signal lines are partially located in the supplementary transition region.

15. The display panel according to claim 1, wherein the plurality of region segments comprise at least two adjacent first region segment and second region segment, the first region segment is provided with A1 sub-pixels arranged side by side along the first direction and B1 extension segments arranged side by side along the second direction, the second region segment is provided with A2 sub-pixels arranged side by side along the first direction and B2 extension segments arranged side by side along the second direction, A1 is less than A2, A1 is less than B1, and A1, B1, A2, and B2 are all natural numbers.

16. A display panel, wherein the display panel comprises sub-pixels, a driving circuit for driving at least a part of the sub-pixels, and a signal line connecting the sub-pixel and the driving circuit, the driving circuit is located on a side of the sub-pixel in a first direction, the signal line comprises an extension segment extending along the first direction, a plurality of extension segments of a plurality of signal lines are arranged side by side along a second direction, and the first direction intersects the second direction;

wherein the display panel comprises a plurality of region segments arranged side by side along the second direction, and the region segment comprises a display segment and a transition segment arranged along the first direction, the sub-pixel is located in the display segment, and at least a part of the extension segment is located in the transition segment.

17. The display panel according to claim 16, wherein the plurality of region segments comprise at least two adjacent first region segment and second region segment, the first region segment is provided with A1 sub-pixels arranged side by side along the first direction and B1 extension segments arranged side by side along the second direction, the second region segment is provided with A2 sub-pixels arranged side by side along the first direction and B2 extension segments arranged side by side along the second direction, A1 is less than A2, A1 is less than B1, and A1, B1, A2, and B2 are all natural numbers.

18. The display panel according to claim 16, wherein at least a part of the signal lines each further comprises a connection segment, at least a part of the extension segments are connected to the sub-pixels via the connection segment, and the connection segment and the extension segment are located in different membrane layers.

19. The display panel according to claim 16, wherein at least two display segments adjacent along the second direction at least partially overlap, and/or at least two transition segments adjacent along the second direction at least partially overlap.

20. The display panel according to claim 16, wherein in two adjacent region segments, the display segment of one region segment at least partially overlaps the transition segment of the other region segment along the second direction.

* * * * *